United States Patent

Hart, Jr. et al.

[15] 3,694,763

[45] Sept. 26, 1972

[54] DIFFERENTIAL CURRENT SENSE AMPLIFIER

[72] Inventors: Thomas W. Hart, Jr., Phoenix; Panayotis C. Economopoulos, Scottsdale, both of Ariz.

[73] Assignee: Semi-Conductor Electronic Memories Incorporated, Phoenix, Ariz.

[22] Filed: July 7, 1970

[21] Appl. No.: 52,972

[52] U.S. Cl. ..................330/30 D, 330/23, 330/30 R

[51] Int. Cl. ..............................................H03f 3/68

[58] Field of Search .............330/23, 24, 30, 30 D, 69

[56] References Cited

UNITED STATES PATENTS 3,502,905 3/1970 Bicking....................330/24 X 3,505,537 4/1970 Giordano................330/30 X

*Primary Examiner*—Roy Lake

*Assistant Examiner*—Lawrence J. Dahl

*Attorney*—Samuel Lindenberg and Arthur Freilich

[57] ABSTRACT

A differential amplifier is provided which, by the addition of diodes and transistors isolates input from output for common mode while enabling a low differential impedance. A constant current source is also provided for the amplifier which is substantially unaffected by power supply or temperature variations.

7 Claims, 3 Drawing Figures

PATENTED SEP 26 1972 3,694,763

THOMAS W. HART
PANAYOTIS C. ECONOMOPOULOS
INVENTORS

BY

Sandenberg, Frankel & Wasserman

ATTORNEYS

DIFFERENTIAL CURRENT SENSE AMPLIFIER

BACKGROUND OF THE INVENTION

This invention relates to differential amplifiers used for sensing the state of stored information within memory arrays, and more particularly to improvements therein.

Presently available differential sensing amplifiers have been used to detect the difference voltage between a pair of signal lines while rejecting any common mode voltage on those lines. These amplifiers present a high impedance load both in common mode as well as differentially to those lines and to following equipment. Since semiconductor circuits usually operate with a low impedance, a need exists for a differential sense amplifier which will detect differences in current in a pair of these output lines, presenting a low differential impedance for better matching characteristics, while rejecting any common mode voltage on those lines by presenting a high common mode impedance thereto.

These differential sense amplifiers employ one or more constant current sources for operation. Temperature or power supply fluctuations which alter these constant current sources also alter the sensitivity and/or gain of the amplifier.

OBJECTS AND SUMMARY OF THE INVENTION

An object of this invention is to provide a differential current sense amplifier which has a low input differential impedance and a high input common mode impedance.

Yet another object of the present invention is the provision of a differential current sense amplifier which is more stable that those available heretofore.

Still another object of the present invention is the provision of a differential sense amplifier which is insensitive to temperature and power supply variations.

The foregoing and other objects of the invention are achieved in an arrangement wherein a basic differential current sensing amplifier circuit which has Darlington inputs and feedback diodes connected from the collectors of the output transistors to the bases of the input transistors, are modified by the addition of a diode between the operating potential source and the collector of each output transistor to which the feedback diode is connected. Further, a transistor is connected to the junction of the added diode and the source of operating potential to become the output transistor. In addition, constant current sources, required for biasing the Darlington input circuits are provided by a novel series diode-parallel transistor circuit arrangement in which variations in power supply voltage or voltage changes, due to circuit component changes caused by temperature variations, are sensed by the transistors and converted into corrections in the current being supplied, so as to compensate for these changes.

DESCRIPTION OF THE PREFERRED EMBODIMENTS

Figures 1, 2, 3:
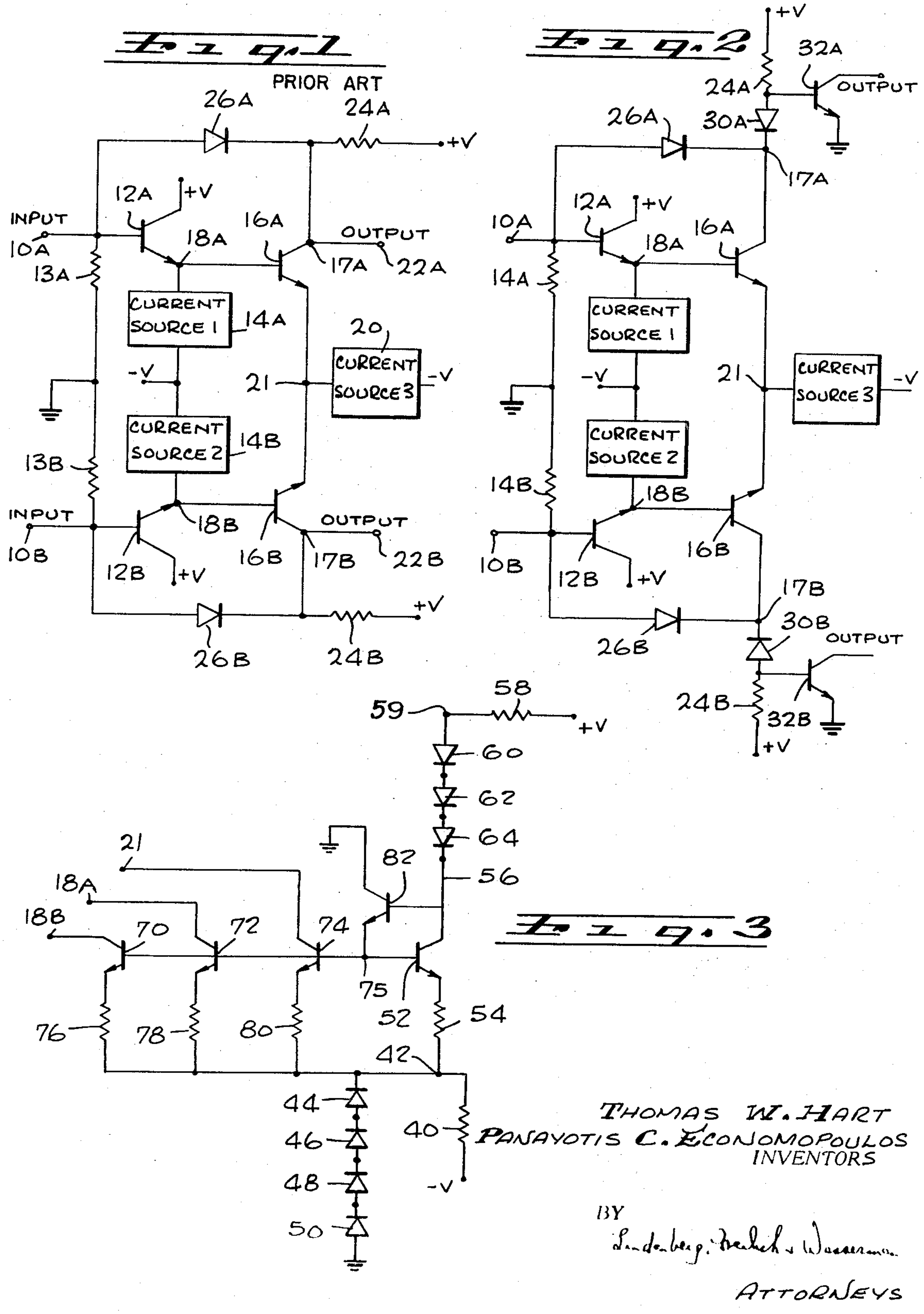
FIG. 1 is a circuit diagram of the present differential current sense amplifier.
FIG. 2 is a circuit diagram of the improved differential current sense amplifier in accordance with this invention.
FIG. 3 is a circuit diagram of a novel, constant current source, which may be used either with the embodiment of the invention shown in FIG. 2 or with the prior art circuit shown in FIG. 1.

The circuit shown in FIG. 1 is the presently known differential current sense amplifier. It is being shown in order to provide a better appreciation for improvements made in accordance with this invention.

As indicated, the purpose of the differential current sense amplifier is to detect a difference current between a pair of signal lines while rejecting any common mode voltage on those lines. The circuit shown in FIG. 1 has the two lines connected to input terminals respectively 10A and 10B. These lines respectively connect to the bases of respective transistors 12A, 12B. The respective lines also connect to ground, through respective resistors 13A, 13B.

The collectors of transistors 12A and 12B are respectively connected to a source of operating potential, designated as +V. The emitters of the respective transistors 12A, 12B, are connected to the respective current sources 14A and 14B and also to the bases of the respective transistors 16A and 16B. The connection of the emitter of transistor 12A and the base of transistor 16A and the current source 14A is designated as junction 18A. The junction of the connection of the emitter of transistor 12B, the base of transistor 16B, and the second current source 14B is designated as 18B. The respective current sources 14A and 14B which are indicated as current sources 1 and 2, respectively, are both connected to a negative source of operating potential, designated as −V.

The emitters of the respective transistors 16A and 16B are connected together into a third current source 20, which is connected to a negative operating potential designated as −V. The collectors of the respective transistors 16A, 16B are connected to respective output terminals 22A and 22B. The collectors of these transistors 16A and 16B respectively connect to junction points 17A and 17B and then through resistors 24A and 24B to a positive operating potential source, designated as +V. Two feedback diodes, respectively designated as diode 26A and 26B are respectively connected between the collectors of transistors 16A and 16B, and the bases of transistors 12A and 12B.

With the circuit shown in FIG. 1, the same, or substantially similar, voltages applied to the inputs 10A and 10B will have no effect on the outputs 22A and 22B, since the equal current flow in both sides of the circuits causes cancellation in the output transistors 16A, 16B and thus the outputs do not move. However, a change in the input applied to one terminal above that applied to the other terminal causes the associated output terminal to shift in voltage with respect to the voltage of the other output terminal whereby the differential input is sensed.

The diodes 26A, 26B will pass current to the output terminals if the input voltage exceeds the voltage at the respective junctions 17A, 17B. This can adversely effect equipment coupled to the differential amplifier giving rise to excessive and sometimes spurious signals. The impedance seen by equipment to which the amplifier is substantially coupled is the same whether the input is a common mode or a differential signal.

FIG. 2 is a circuit diagram of a sense amplifier which is modified in accordance with this invention. Similar functioning circuit elements are given the same reference numerals as are shown in FIG. 1. With this in view, the improvement consists of the addition of two diodes 30A, 30B, which are inserted between the load resistors respectively 24A, and 24B and the collectors of the transistors 16A, and 16B. In addition, the junction between the respective diodes 30A and 30B and the load resistors 24A and 24B are respectively connected to the bases of output transistors 32A and 32B. The emitters of these transistors 32A and 32B are connected to ground, and the collectors comprise the output terminals.

The diodes 30A and 30B provide temperature compensation and also serve to isolate the input of the amplifier from the output transistors 32A and 32B. This is done so that the sense amplifier can be used in conjunction with other circuitry that might cause the voltage on the input terminals to exceed normal operating range in the positive direction. That is, in the case of FIG. 2, should the outputs be connected to a strongly negative source, the inputs could not go positive. The polarity of the diodes 30A and 30B of FIG. 2 is such that a strongly positive signal at the input blocks them and thereby decouples the input from the output. Equipment, to which this differential sense amplifier is coupled by virtue of connection to the collectors of the respective transistors 32A and 32B, see a high impedance looking back at the differential amplifier for common mode operation. For the differential sensing operation enabling signals applied to the base of either transistor 32A or 32B lower the impedance seen considerably.

When an input signal is applied to terminal 10A, it causes an increase in the current flowing through transistor 16A while the current flowing through transistor 16B decreases. This causes the current flowing through resistor 24B to now flow into the base of transistor 32B causing its collector to switch to an ON condition. The exact opposite action occurs when signal current flows into input terminal 10B causing transistor 16B to turn on and 16A to turn off.

It will be appreciated that the combination of the output transistors and diodes which are added in accordance with this invention serve to isolate the output in the presence of common mode signals, thus presenting a high impedance.

FIG. 3 is a circuit diagram, in accordance with this invention, of the current source 1, current source 2 and current source 3. The arrangement shown, when used with either of the current sense amplifiers shown in FIG. 1 or FIG. 2, renders them insensitive to power supply and temperature variations.

The circuit includes a resistor 40, connected between a negative operating potential source, designated $-V$ and a junction 42. Between this junction and ground there are four serially connected diodes 44, 46, 48, and 50. A transistor 52, has its emitter connected through a resistor 54 to the junction 42. The collector of this transistor is connected to a junction 56. A positive potential $+V$ is applied to a resistor 58, which is connected in series with three diodes 60, 62 and 64 between the positive potential and junction 56.

Three transistors respectively 70, 72 and 74, have their collectors respectively connected to the junction points 18B, 18A and 21 in the current sense amplifier shown in FIG. 1 or FIG. 2. The respective emitters of the transistors 70, 72 and 74, are connected to the junction 42 through respective resistors 76, 78, and 80. The respective bases of transistors 70, 72 and 74 are connected to a junction 75, which is the point to which the base of transistor 52 and the emitter of a transistor 82 are connected. The base and collector of transistor 82 are respectively connected to junction point 56 and to ground.

Resistor 40, in conjunction with diodes 44 46, 48 50 form a voltage regulator for junction 42. This voltage will be equal to the four diode junction potentials represented as $-4\Delta$ where $\Delta$ is a symbol representing the potential of each diode junction. This voltage will be relatively insensitive to small power supply variations. This voltage is, however, temperature dependent and is included in the $\Delta$ term.

The resistance or resistor 54 has a fairly low value and therefore the voltage drop thereacross may be neglected. Junction 56 is at a potential of $-2\Delta$ and junction 59, which is between resistor 58 and diode 60, is at a potential of $+1\Delta$.

Transistors 70, 72 and 74, which have all of their bases connected together and to the junction 75, act as current generators. Transistor 52 is the reference current transistor and transistor 82 is the feedback regulator transistor.

Resistor 58 determines the reference current through transistor 52. Transistor 82, in conjunction with transistor 52, acts to regulate the voltage at the junction 75 such that this reference current will always flow through transistor 52. This same reference voltage at the junction 75 is applied to the bases of transistor 70, 72 and 74. The emitter resistors respectively 76, 78 and 80 of these transistors are scaled so as to cause the appropriate constant currents to flow in their respective collectors. Furthermore, emitter areas of transistors 70, 72, 74 with respect to transistor 52 can be scaled so as to cause the appropriate constant currents to flow in their respective collectors. If this is done resistors 76, 78, 80, and 54 can in the limit be set to zero.

Now, for a given quiscent operating point of the sense amplifier, for example with the diode 26A zero biased and the inputs at zero voltage, the base of transistor 32A is at a potential of $+1\Delta$, which is the same as that of junction 59 in the current generator circuit. If the power supply voltage $+V$ is changed, the currents will change so as to exactly compensate for that, keeping the quiscent point of the sense circuit the same. This occurs by reason of the fact that any change in $+V$ is applied to the base of transistor 82 causing the current flowing therethrough to change in the direction to alter the voltage applied to the base of transistor 52 whereby the current flowing through the transistor 52 is changed in a direction to alter this signal applied to the base of transistor 82 to restore the potential at the junction 75 to what it was before the change occurred. Temperature variations, causing resistor changes or diode junction voltage changes, are also compensated for in this manner.

There is accordingly described and shown herein a novel, useful and improved differential sensing amplifier circuit which has improved impedance characteristics and which is substantially insensitive to temperature and power supply variations.

Although particular embodiments of the invention have been described and illustrated herein, it is recognized that modifications and variations may readily occur to those skilled in the art and consequently it is intended that the claims be interpreted to cover such modifications and equivalents.

What is claimed is:

1. In a differential sense amplifier of the bilateral type wherein each half includes an input terminal, a first transistor having its base connected to said input terminal, its emitter connected to a current source and its collector connected to a source of operating potential, a second transistor having its base connected to the emitter of the first transistor, its emitter connected to a current source, and its collector connected to a source of operating potential and to an output terminal, and a first diode connected between the output terminal and the input terminal, the improvement in each side of said bilateral differential sensing amplifier comprising:

a second diode connected between the collector of said second transistor and said source of operating potential, and a third transistor having base, emitter and collector electrodes, means connecting said third transistor collector to said output terminal, means connecting said third transistor emitter to ground, and means connecting said third transistor base to the junction point between said second diode and said source of operating potential.

2. The improvement in a differential sense amplifier of the bilateral type comprising on each side, an input terminal, a first transistor having base, emitter and collector electrodes, means connecting said first transistor base to said input terminal, a first current source, means connecting said first transistor emitter to said first current source, a source of operating potential, means connecting said first transistor collector to said source of operating potential, a second transistor having base collector and emitter electrodes, means connecting said second transistor base to said first transistor emitter, a second current source, means connecting said second transistor emitter to said second current source, a first and a second diode, means connecting said first diode between said input terminal and said second transistor collector, means connecting said second diode between said second transistor collector and said source of operating potential, a third transistor, having base, collector and emitter electrodes, means connecting said third transistor base between said second diode and said source of operating potential, means connecting said second transistor emitter to ground, an output terminal, and means connecting said third transistor collector to said output terminal.

3. A differential sense amplifier as recited in claim 2 wherein said first current source includes first, second and third transistors, each having base, collector and emitter electrodes, means connecting said first transistor collector to said second transistor base, means connecting said first transistor base to said second transistor emitter, means connecting said second transistor collector to ground, a first source of operating potential, first diode means connecting said second transistor base to said first source of operating potential, a first resistor, a second resistor, a second source of operating potential, means connecting said first and second resistors in series between said second source of operating potential and said first transistor emitter, second diode means, means connecting said second diode means to the junction between said first and second resistors and ground, a third resistor, means connecting said third resistor between said first and second resistors and the emitter of said third transistor, means connecting the base of said third transistor to said first transistor base, and means connecting the collector of said third transistor to an output terminal of said current source.

4. In a differential sense amplifier of the bilateral type wherein each half includes an input terminal, first transistor and second transistors, each transistor having base, emitter and collector electrodes, means connecting the first transistor base to said input terminal, means connecting the first transistor emitter and the second transistor base to an output terminal of a first current source, means connecting the first transistor collector to a source of operating potential, means connecting the second transistor collector to said source of operating potential and to an output terminal of the amplifier half, means connecting the second transistor emitter to and output terminal of a second current source, and a diode connected between the input and output terminals of the amplifier half, at least one of said current sources comprising:

third, fourth and fifth transistors, each having base, collector and emitter electrodes, means connecting said third transistor collector to said fourth transistor base, means connecting said third transistor base to said fourth transistor emitter, means connecting said fourth transistor collector to ground, a third source of operating potential, third diode means connecting said fourth transistor base to said third source of operating potential, a third resistor, a fourth resistor, a fourth source of operating potential, means connecting said third and fourth resistors in series between said fourth source of operating potential and said third transistor emitter,
fourth diode means,
means connecting said fourth diode means to the junction between said third and fourth resistors and ground,
a fifth resistor,
means connecting said fifth resistor between said third and fourth resistors and the emitter of said fifth transistor,
means connecting the base of said fifth transistor to said third transistor base, and
means connecting the collector of said fifth transistor to an output terminal of said current source.

5. In a differential sense amplifier as recited in claim 1 wherein said second diode is connected to enable current flow from said source of operating potential to said second transistor, and
a resistor is connected between said second diode and said source of operating potential.

6. In a differential sense amplifier as recited in claim 1 wherein the current source to which the emitters of said first and second transistors are connected includes:
a source of positive potential,
a source of negative potential,
a point of reference potential,
a first resistor connected between the source of negative potential and a first junction point,
first diode means connected between the first junction point and the point of reference potential,
fourth transistor means having base emitter and collector electrodes,
means connecting the emitter of said fourth transistor means to said first junction point,
a second junction point,
means connecting the collector of said fourth transistor means to said second junction point,
a third junction point,
diode means connected between said second junction point and said third junction point,
means connecting said third junction point to said source of positive potential,
fifth transistor means having emitter collector and base electrodes,
means connecting the base of said fifth transistor means to said second junction point,
means connecting the emitter of said fifth transistor means to the base of said fourth transistor means,
means connecting the collector of said fifth transistor means to the point of reference potential,
sixth transistor means having base emitter and collector electrodes,
means connecting the base of said sixth transistor means to the base of said fourth transistor means,
means connecting the emitter of said sixth transistor means to the first junction point, and
means connecting the collector of said sixth transistor means to the emitters of said first and second transistors.

7. The improvement in a differential sense amplifier of the bilateral type which require two current sources for the input transistors and a third current source for the output transistors, an improved current source arrangement comprising:
a source of positive potential,
a source of negative potential,
a point of reference potential,
a first resistor connected between the source of negative potential and a first junction point,
first diode means connected between the first junction point and the point of reference potential,
first transistor means having base emitter and collector electrodes,
means connecting the emitter of said first transistor means to said first junction point,
a second junction point,
means connecting the collector of said first transistor means to said second junction point,
a third junction point,
diode means connected between said second junction point and said third junction point,
means connecting said third junction point to said source of positive potential,
second transistor means having emitter collector and base electrodes,
means connecting the base of said second transistor means to said second junction point,
means connecting the emitter of said second transistor means to the base of said first transistor means,
means connecting the collector of said second transistor means to the point of reference potential,
third, fourth and fifth transistor means each having a base, emitter and collector electrodes,
the bases of said third, fourth and fifth transistor means being connected to the base of said fourth transistor means,
the emitters of said third, fourth and fifth transistor means being connected to the first junction point,
means connecting the emitters of said third, fourth and fifth transistor means respectively to the first transistor emitter, and
means connecting the collectors of said third and fourth transistor means to said differential amplifier two input transistors and the fifth transistor means collector to the two output transistors.

* * * * *